(12) United States Patent
Takachi et al.

(10) Patent No.: US 9,337,020 B2
(45) Date of Patent: May 10, 2016

(54) RESIST MASK PROCESSING METHOD USING HYDROGEN CONTAINING PLASMA

(71) Applicant: TOKYO ELECTRON LIMITED, Tokyo (JP)

(72) Inventors: Michihisa Takachi, Hwaseong (KR); Yusuke Shimizu, Hwaseong (KR); Toshihisa Ozu, Hwaseong (KR)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/403,794

(22) PCT Filed: Jun. 17, 2013

(86) PCT No.: PCT/JP2013/066561
§ 371 (c)(1),
(2) Date: Nov. 25, 2014

(87) PCT Pub. No.: WO2014/002808
PCT Pub. Date: Jan. 3, 2014

(65) Prior Publication Data
US 2015/0104957 A1 Apr. 16, 2015

(30) Foreign Application Priority Data
Jun. 25, 2012 (JP) .................. 2012-141961

(51) Int. Cl.
*H01L 21/02* (2006.01)
*H01J 37/32* (2006.01)
*H01L 21/027* (2006.01)
*H01L 21/033* (2006.01)
*H01L 21/3213* (2006.01)
(Continued)

(52) U.S. Cl.
CPC ....... *H01L 21/02315* (2013.01); *H01J 37/3222* (2013.01); *H01J 37/32192* (2013.01); *H01L 21/0273* (2013.01); *H01L 21/0332* (2013.01); *H01L 21/0337* (2013.01); *H01L 21/30604* (2013.01); *H01L 21/31116* (2013.01); *H01L 21/31138* (2013.01); *H01L 21/32139* (2013.01)

(58) Field of Classification Search
None
See application file for complete search history.

(56) References Cited

U.S. PATENT DOCUMENTS

| 4,541,166 A * | 9/1985 | Yamazaki ............. 438/238 |
| 5,204,210 A * | 4/1993 | Jansen et al. .......... 430/198 |
| 2005/0103748 A1* | 5/2005 | Yamaguchi et al. ....... 216/67 |

(Continued)

FOREIGN PATENT DOCUMENTS

JP  2008-198988 A  8/2008

OTHER PUBLICATIONS

International Search Report mailed Aug. 27, 2013 in PCT/JP2013/066561.

(Continued)

*Primary Examiner* — Charles Garber
*Assistant Examiner* — Brigitte Paterson
(74) *Attorney, Agent, or Firm* — Rothwell, Figg, Ernst & Manbeck, P.C.

(57) ABSTRACT

A method for processing a resist mask includes: (a) a step of preparing, in a processing chamber, a target object to be processed having a patterned resist mask provided thereon; and (b) a step of generating a plasma of the hydrogen-containing gas by supplying a hydrogen-containing gas and supplying a microwave into the processing chamber. The hydrogen-containing gas may be, e.g., $H_2$ gas.

15 Claims, 10 Drawing Sheets

(51) Int. Cl.
*H01L 21/306* (2006.01)
*H01L 21/311* (2006.01)

(56) References Cited

U.S. PATENT DOCUMENTS

2005/0199586 A1* 9/2005 Matsushita et al. ............ 216/67
2008/0182419 A1* 7/2008 Yasui ................. H01L 21/0273
 438/710
2013/0267097 A1* 10/2013 Srivastava et al. ............ 438/710

OTHER PUBLICATIONS

Myeong-Cheol Kim, et al., "Effects of various plasma pretreatments on 193 nm photoresist and linewidth roughness after etching," Journal of Vacuum Science & Technology B 24, 2645 (2006); doi: 10.1116/1.2366616 (9 pages).

* cited by examiner

RESIST MASK PROCESSING METHOD USING HYDROGEN CONTAINING PLASMA

CROSS REFERENCE TO RELATED APPLICATION

This application is a 35 U.S.C. 371 National Phase Entry Application from PCT/JP2013/066561, filed Jun. 17, 2013, which claims priority to Japanese Patent Application No. 2012-141961, filed Jun. 25, 2012, the disclosures of which are incorporated herein in their entirety by reference.

FIELD OF THE INVENTION

The present invention relates to a resist mask processing method.

BACKGROUND OF THE INVENTION

In a semiconductor device manufacturing process, an etching target layer is etched with a mask in order to form a desired shape, e.g., a groove or a hole, in the etching target layer. As for the mask for use in etching the etching target layer, a resist mask may be used. Alternatively, a hard mask may be formed by etching a layer having selectivity to the etching target layer with the resist mask.

In order to etch the etching target layer or a layer to be used as the mask later, the resist mask for use in etching is exposed to an etchant gas and a plasma thereof. Therefore, the resist mask needs to have etching resistance to the etchant gas and the plasma thereof.

A curing (hardening) process using a plasma of hydrogen gas has been conventionally used as a processing method for increasing the etching resistance of the resist mask. Such a processing method is disclosed in Non-Patent Document 1. In the method disclosed in Non-Patent Document 1, the resist mask is cured by the plasma of the hydrogen gas supplied to an inductively coupled plasma processing apparatus.

Non-Patent Document 1: Myeong-Cheol Kim et al., "Effects of various plasma Pretreatments on 193 nm photoresist and linewidth roughness after etching", JOURNAL OF VACUUM SCIENCE & TECHNOLOGY B 24 (6), November/December 2006, pages 2645 to 2652

According to Non-Patent Document 1, when the resist mask is first processed by using the plasma of the hydrogen gas and then a hard mask is formed by etching using the processed resist mask, the resist mask having 70 nm line feature has a variation in the linewidth, i.e., linewidth roughness (LWR), of about 9 nm.

Generally, the variation in the linewidth of the resist mask is reflected in the hard mask. Therefore, when the etching target layer is etched by using the hard mask, the variation in the linewidth of the resist mask is reflected in the shape formed in the etching target layer. This may further deteriorate characteristics of a semiconductor device including the etching target layer.

For example, in a MOS transistor having a gate formed by using the hard mask, which is formed by the method disclosed in Non-Patent Document 1, a channel length designed to be 70 nm may be changed to 79 nm. Here, a current $I_{ds}$ between a source and a drain of the MOS transistor satisfies relationship of the following Eq. (1):

$$I_{ds} = \mu_{eff} C_{ox} \frac{W}{L} (V_g - V_t) V_{ds} \qquad \text{Eq. (1)}$$

where $\mu_{eff}$ indicates the effective channel mobility; $C_{ox}$ indicates the gate oxide capacitance per unit area; W indicates the channel width; L indicates the channel length; $V_g$ indicates the gate voltage; $V_t$ indicates the threshold voltage; and $V_{ds}$ indicates the voltage between the source and the drain.

As can be seen from Eq. (1), the current $I_{ds}$ between the source and the drain is in inverse proportion to the channel length L. Therefore, when the channel length, which is designed to be 70 nm, becomes 79 nm, the current $I_{ds}$ is decreased by about 12% compared to the case of the channel length of 70 nm. During the operation of the MOS transistor, ON current $I_{on}$ needs to be maintained at a constant level. Therefore, in order to deal with the decrease of the current $I_{ds}$, a power supply voltage needs to be increased. For example, the power supply voltage needs to be increased by about 13% to make the current $I_{ds}$ in the case of the channel length of 79 nm identical to the current $I_{ds}$ in the case of the channel length of 70 nm. As a consequence, the power consumption is increased. Further, the variation in the channel length may deteriorate ON current/OFF current characteristics of the MOS transistor.

SUMMARY OF THE INVENTION

In order to suppress deterioration of characteristics of the semiconductor device, the dimensional variation in the pattern of the resist mask needs to be reduced. Therefore, in this technical field, it is required to reduce the dimensional variation of the resist mask in a process for improving etching resistance of the resist mask.

In accordance with an embodiment of the present invention, there is provided a method for processing a resist mask including: (a) preparing, in a processing chamber, a target object to be processed having a patterned resist mask provided thereon; and (b) generating a plasma of a hydrogen-containing gas by supplying the hydrogen-containing gas and supplying a microwave into the processing chamber. Further, the hydrogen-containing gas may be $H_2$ gas.

In the method of the Non-Patent Document 1, the plasma of the hydrogen gas is generated by using the inductively coupled plasma processing apparatus. In the inductively coupled plasma processing apparatus, hydrogen radicals are generated by exciting the plasma of the hydrogen gas. The resist mask is cured by the modification using the hydrogen radicals. Further, due to the generation of the plasma of the hydrogen gas, UV rays are generated in the processing chamber of the plasma processing apparatus. This UV rays selectively dissociate C—O bond of a side chain of the material forming the resist mask. The dissociation of the C—O bond by the UV rays leads to disconnection of the side chain of the material forming the resist mask, and this can contribute to the improvement of the dimensional accuracy of the resist mask. However, the energy, e.g., an electron temperature, of the plasma generated in the inductively coupled plasma processing apparatus is high, and thus C—C bond of a main chain of the material forming the resist mask can be disconnected by the high-energy plasma. As a result, when the resist mask is processed by the plasma of the hydrogen gas generated in the inductively coupled plasma processing apparatus, the dimensional variation of the resist mask is increased.

In the method in accordance with the embodiment of the present invention, the plasma of the hydrogen gas is excited by the microwave. The energy of the plasma excited by the microwave is lower than the energy of the plasma excited by the inductively coupled plasma processing apparatus. For example, the energy of the plasma excited by the microwave is ¼ to ⅕ of the energy of the plasma excited by the inductively coupled plasma processing apparatus. Hence, in the method in accordance with the embodiment of the present invention, the resist mask can be modified by using hydrogen radicals. Further, the side chain can be disconnected by dissociating the C—O bond of the side chain of the material forming the resist mask while the disconnection of the C—C bond of the main chain can be suppressed. As a result, the method in accordance with the embodiment of the present invention can reduce the dimensional variation of the resist mask.

The method in accordance with the embodiment of the present invention may further include (c), before the generating the plasma of the hydrogen-containing gas, generating a plasma of the fluorine-containing gas by supplying a fluorine-containing gas and supplying the microwave into the processing chamber where the target object is accommodated. Further, the fluorine-containing gas may be $CH_3F$ gas. In accordance with the embodiment of the present invention, shrinkage of a pattern extending in one direction, e.g., a line pattern can be suppressed in its extending direction.

Effect of the Invention

As described above, in accordance with the aspect and embodiment of the present invention, it is possible to provide a method for reducing dimensional variation of a resist mask in a process for improving etching resistance of the resist mask.

DETAILED DESCRIPTION OF THE EMBODIMENTS

Figure 1:
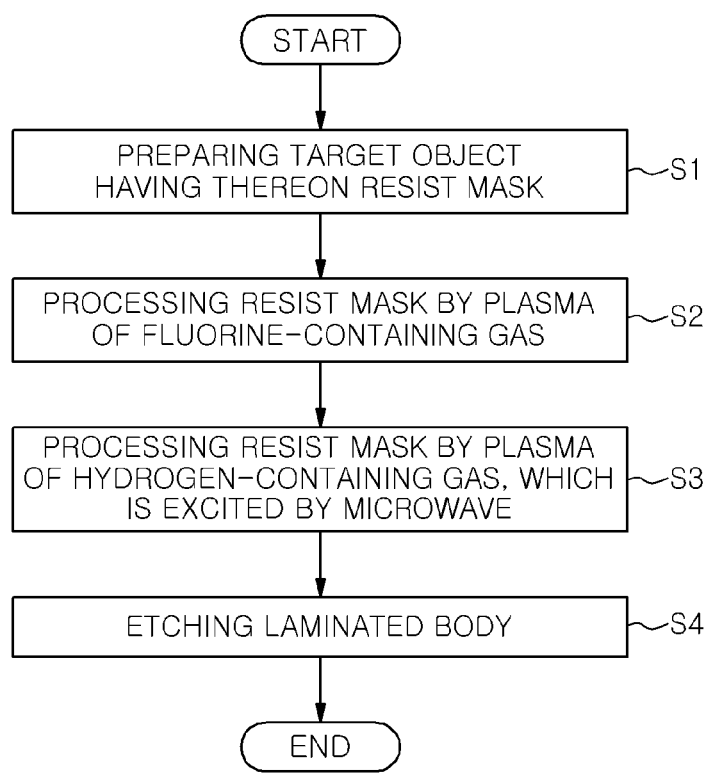
FIG. 1 is a flowchart showing a resist mask processing method in accordance with an embodiment of the present invention.

Hereinafter, various embodiments of the present invention will be described with reference to the accompanying drawings. Throughout the drawings, like reference numerals will be given to like or corresponding parts.

Figure 2:
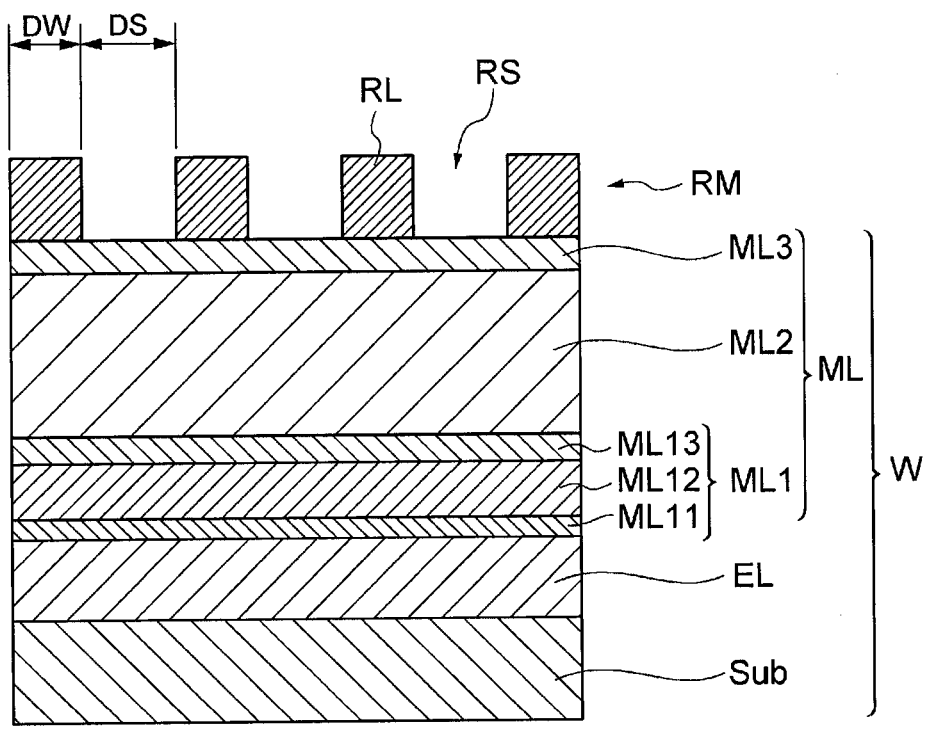
FIG. 2 is a cross sectional view showing an example of a target object to be processed.
Figure 2:
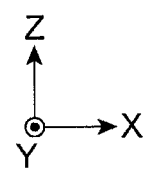

FIG. 1 is a flowchart showing a resist mask processing method in accordance with an embodiment of the present invention. In this method, first, a target object to be processed W is prepared in a step S1. In the present embodiment, FIG. 2 is a cross sectional view showing an example of the target object. In the example shown in FIG. 2, the target object W includes an etching target layer EL formed on a substrate Sub. The etching target layer EL is, e.g., a polycrystalline silicon layer.

Formed on the etching target layer EL is a laminated body ML that will become a hard mask later. In the example shown in FIG. 2, the laminated body ML includes a first layer ML1, a second layer ML2 and a third layer ML3. The first layer ML1 is formed on the etching target layer EL and has a multilayer structure of three layers ML11 to ML13 in this example. The layers ML11 to ML13 may be a $SiO_2$ layer, a SiN layer and a $SiO_2$ layer, respectively. The second layer ML2, e.g., a SOH layer, is formed on the first layer ML1. The third layer ML3, e.g., a SiON layer, is formed on the second layer ML2.

A resist mask RM for use in etching the laminated body ML is formed on the laminated body ML. The resist mask RM has a plurality of lines RL having spaces RS therebetween, for example. The resist mask RM is patterned by using a lithography technique.

Referring back to FIG. 1, in the step S1, the target object W having thereon the patterned resist mask RM is accommodated in a processing chamber of a plasma processing apparatus. In the method of the present embodiment, the resist mask RM is processed in a step S3 following after the step S1 by a plasma of a hydrogen-containing gas which is excited by a microwave. The step S3 will be described in detail later.

In the present embodiment, the resist mask processing method may further include a step S2 between the steps S1 and S3. In the step S2, the resist mask RM can be processed by a plasma of a fluorine-containing gas. The step S2 will be described in detail later.

In the present embodiment, in a step S4, the hard mask M is formed on the etching target layer EL by etching the laminated body ML in the pattern of the resist mask RM that has been processed in the steps S2 and S3. The etching target layer EL can be etched in the pattern of the hard mask M.

Figure 3:
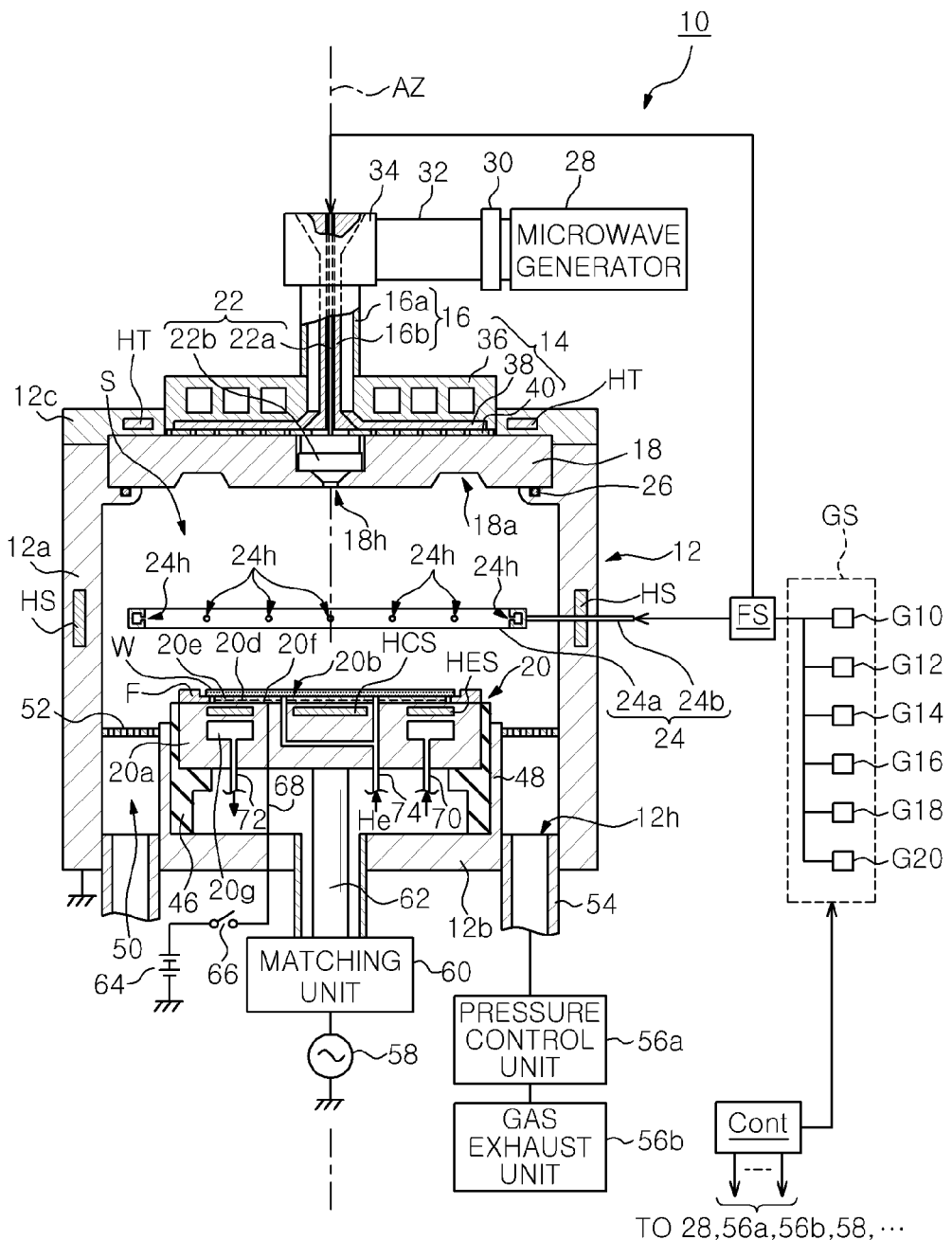
FIG. 3 is a cross sectional view schematically showing a plasma processing apparatus in accordance with the embodiment of the present invention.

Hereinafter, an example of the plasma processing apparatus capable of performing the steps S2 to S4 in the same processing chamber will be described. FIG. 3 is a cross sectional view schematically showing the plasma processing apparatus of the present embodiment. A plasma processing apparatus 10 shown in FIG. 3 includes a processing chamber 12.

The processing chamber 12 defines a processing space S for accommodating the target object W. The processing chamber 12 may include a sidewall 12a, a bottom wall 12b and a ceiling 12c. The sidewall 12a has a substantially cylindrical shape extending in a direction of an axis AZ (hereinafter, referred to as "axis AZ direction"). The bottom wall 12b is provided at the lower end side of the sidewall 12a. A gas exhaust hole 12h through which a gas is exhausted is provided in the bottom wall 12b. The sidewall 12a has an open upper end. The open upper end of the sidewall 12a is blocked by a dielectric window 18. The dielectric window 18 is held between the upper end portion of the sidewall 12a and the ceiling 12c. A seal member 26 may be provided between the dielectric window 18 and the upper end portion of the sidewall 12a. The seal member 26 is, e.g., an O-ring, and contributes to airtight sealing of the processing chamber 12.

The plasma processing apparatus 10 further includes a stage 20 provided in the processing chamber 12. The stage is provided below the dielectric window 18. In the present embodiment, the stage 20 includes a table 20a and an electrostatic chuck 20b.

The table 20a is supported by a cylindrical support 46. The cylindrical support 46 is made of an insulating material and extends vertically upwardly from the bottom wall 12b. Further, a conductive cylindrical supporting portion 48 is provided at the outer periphery of the cylindrical support 46. The cylindrical supporting portion 48 extends vertically upwardly from the bottom wall 12b of the processing chamber 12 along the outer periphery of the cylindrical support 46. An annular gas exhaust path 50 is formed between the cylindrical supporting portion 48 and the sidewall 12a.

An annular baffle plate 52 having a plurality of through holes is attached at an upper portion of the gas exhaust path 50. The gas exhaust path 50 is connected to a gas exhaust line 54 having at an end thereof the gas exhaust hole 12h, and a gas exhaust unit 56b is connected to the gas exhaust line 54 via a pressure control unit 56a. The gas exhaust unit 56b includes a vacuum pump such as a turbo molecular pump or the like. The pressure control unit 56a adjusts a pressure in the processing chamber 12 by adjusting the gas exhaust amount of the gas exhaust unit 56b. A pressure in the processing space S in the processing chamber 12 can be depressurized to a desired vacuum level by the pressure control unit 56a and the gas exhaust unit 56b. By operating the gas exhaust unit 56b, a processing gas may be exhausted from the outer periphery of the stage 20 through the gas exhaust path 50.

The table 20a also serves as a high frequency electrode. A high frequency power supply 58 for RF bias is electrically connected to the table 20a via a matching unit and a power supply rod 62. The high frequency power supply 58 outputs a high frequency power having a frequency suitable for controlling the energy of ions to be attracted to the target object W, e.g., a frequency of 13.65 MHz, at a predetermined power level. The matching unit 60 accommodates a matcher for matching an impedance of the high frequency power supply 58 and an impedance of a load side which is mainly an electrode, a plasma, the processing chamber 12 and the like. A blocking capacitor for self-bias generation is included in the matcher.

An electrostatic chuck 20b is provided on the top surface of the table 20a. In the present embodiment, the top surface of the electrostatic chuck 20b serves as a mounting region where the target object W is mounted. The target object W is held on the electrostatic chuck 20b by electrostatic attraction force. A focus ring F annularly surrounds the target object W at a radially outer side of the electrostatic chuck 20b. The electrostatic chuck 20b includes an electrode 20d and insulation films 20e and 20f. The electrode 20d is made of a conductive film and disposed between the insulation films 20e and 20f. A high voltage DC power supply 64 is electrically connected to the electrode 20d through a switch 66 and a coated wire 68. The electrostatic chuck 20b can attract and hold the target object W on the top surface thereof by a coulomb force generated by a DC voltage applied from the DC power supply 64.

An annular coolant path 20g extending in the circumferential direction is provided in the table 20a. A coolant, e.g., cooling water, of a predetermined temperature is supplied from a chiller unit through pipes 70 and 72 and circulated in the coolant path 20g. The processing temperature of the target object W on the electrostatic chuck 20b may be controlled by the temperature of the coolant. Further, a heat transfer gas, e.g., He gas, from a heat transfer gas supply unit is supplied to a gap between the top surface of the electrostatic chuck 20b and the backside of the target object W through a gas supply line 74.

In the present embodiment, the plasma processing apparatus 10 may further include heaters HT, HS, HCS and HES as temperature control units. The heater HT is provided in the ceiling 12c and extends annularly so as to surround an antenna 14. The heater HS is provided in the sidewall 12a and extends annularly. The heater HS may be provided at a position corresponding to an intermediate portion in the height direction (i.e., in the axis AZ direction) of the processing space S. The heater HCS is provided in the table 20a. The heater HCS is provided, inside the table 20a, below the central portion of the mounting region, i.e. at a region intersecting with the axis AZ. The heater HES is provided in the table 20a and extends annularly so as to surround the heater HCS. The heater HES is provided below the outer peripheral portion of mounting region.

The plasma processing apparatus 10 may further include the antenna 14, a coaxial waveguide 16, a dielectric window 18, a microwave generator 28, a tuner 30, a waveguide 32 and a mode transducer 34. The microwave generator 28 generates a microwave having a frequency of, e.g., 2.45 GHz. The microwave generator 28 is connected to an upper portion of the coaxial waveguide 16 via the tuner 30, the waveguide 32 and the mode transducer 34. The coaxial waveguide 16 extends along the axis AZ that is a central axis of the coaxial waveguide 16. The coaxial waveguide 16 includes an outer conductor 16a and an inner conductor 16b. The external conductor 16a has a cylindrical shape extending in the axis AZ direction. A lower end of the external conductor 16a can be electrically connected to an upper portion of a cooling jacket 36 having a conductive surface. The internal conductor 16b is provided inside of the external conductor 16a. The internal conductor 16b has a cylindrical shape extending along the axis AZ. A lower end of the internal conductor 16b is connected to a slot plate 40 of the antenna 14.

In the present embodiment, the antenna 14 may be provided inside an opening formed at the ceiling 12c. The antenna 14 has a dielectric plate 38 and the slot plate 40. The dielectric plate 38 for reducing wavelength of a microwave has a substantially disc shape. The dielectric plate 38 is made of, e.g., quartz, or alumina, and disposed between the slot plate 40 and the bottom surface of the cooling jacket 36. Accordingly, the antenna 14 can be formed by the dielectric plate 38, the slot plate 40 and the bottom surface of the cooling jacket 36.

Figure 4:
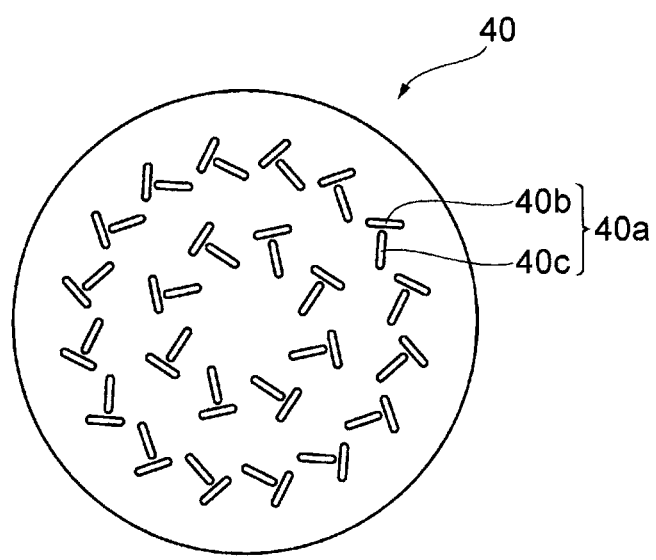
FIG. 4 is a top view showing an example of a slot plate shown in FIG. 1.

The slot plate 40 is a substantially disc-shaped metal plate having a plurality of slot pairs. In the present embodiment, the antenna 14 may be a radial line slot antenna. FIG. 4 is a top view showing an example of the slot plate. A plurality of slot pairs 40a are formed at the slot plate 40. The slot pairs 40a are spaced from each other at a predetermined interval in a radial direction and also spaced from each other in a circumferential direction. Each slot pair 40a has two slot holes 40b and 40c. The slot holes 40b and 40c extend in a direction intersecting with each other or perpendicular to each other.

Referring back to FIG. 3, in the plasma processing apparatus 10, the microwave generated by the microwave generator 28 propagates to the dielectric plate 38 through the coaxial waveguide 16 and then is applied to the dielectric window 18 through the slot holes of the slot plate 40.

The dielectric window 18 has a substantially disc shape and is made of, e.g., quartz or alumina. The dielectric window 18 is disposed directly below the slot plate 40. The microwave from the antenna 14 passes through the dielectric window 18 and then is introduced into the processing space S. Hence, an electric field is generated directly below the dielectric window 18 and a plasma is generated in the processing space. In this manner, the plasma processing apparatus 10 can generate the plasma by using the microwave without applying a magnetic field.

In the present embodiment, a recess 18a can be formed at the bottom surface of the dielectric window 18. The recess 18a is provided annularly about the axis AZ and has a tapered shape. The recess 18a is provided to facilitate generation of a standing wave by the introduced microwave and can effectively generate the plasma by the microwave.

The plasma processing apparatus 10 further includes a central introducing unit 22, a peripheral introducing unit 24 and a gas supply unit GS. The central introducing unit 22 injects a gas toward the target object W along the axis AZ. The central introducing unit 22 includes a conduit 22a and an injector 22b. The conduit 22a passes through an inner hole of the internal conductor 16b of the coaxial waveguide 16. Further, the conduit 22a extends to the space defined by the dielectric window 18 along the axis AZ. The space defined by the dielectric window 18 communicates with a hole 18h. The hole 18h opens toward the processing space S. The injector 22b is provided in the space defined by the dielectric window 18. The injector 22b has a plurality of through holes extending in the axis AZ direction. The central introducing unit 22 configured as described above supplies a gas into the injector 22b through the conduit 22a and injects the gas from the injector 22b into the processing space S through the hole 18h.

The peripheral introducing unit 24 includes an annular line 24a and a pipe 24b. The annular line 24a is provided in the processing chamber 12 so as to annularly extend about the axis AZ at an intermediate position in the axis AZ direction of the processing space S. The annular line 24a has a plurality of gas injection holes 24h that open toward the axis AZ. The gas injection holes 24h are annularly arranged about the axis AZ. The annular line 24a is connected to the pipe 24b, and the pipe 24b extends to the outside of the processing chamber 12. The peripheral introducing unit 24 introduces the processing gas into the processing space toward the axis AZ through the pipe 24b, the annular line 24a and the gas injection holes 24h.

The gas supply unit GS is connected to the central introducing unit 22 and the peripheral introducing unit 24 via a flow splitter FS. The flow splitter FS distributes the gas supplied from the gas supply unit GS to the central introducing unit 22 and the peripheral introducing unit 24 at a distribution ratio set by a control unit to be described later. The gas supply unit GS includes gas sources G10, G12, G14, G16, G18 and G20. The gas sources G10, G12, G14, G16, G18 and G20 are gas sources of $CH_3F$ gas, $H_2$ gas, Ar gas, $CF_4$ gas, HBr gas, and $O_2$ gas, respectively. The gas sources G10, G12, G14, G16, G18 and G20 are configured to be able to control flow rates and may include an opening/closing valve and a mass controller.

As shown in FIG. 3, the plasma processing apparatus 10 may further include a control unit Cont. The control unit Cont may be a controller such as a programmable computer device or the like. The control unit Cont can transmit a control signal to the gas supply unit GS to control flow rates of gases from the gas sources G10, G12, G14, G16, G18 and G20, a supply of the gases and stop of the suppy of the gases. Moreover, the control unit Cont can transmit a control signal to the flow splitter FS to control the distribution ratio of the gas to be distributed to the central introducing unit 22 and the peripheral introducing unit 24. Further, the control unit Cont can transmit control signals to the microwave generator 28, the high frequency power source 58 and the pressure control unit 56a to control the microwave power, the RF bias power and on/off thereof, and the pressure in the processing chamber 12.

Alternatively, the plasma processing apparatus 10 may have a configuration in which other gas supply units same as the gas supply unit GS are provided and connected to the central introducing unit 22 and the peripheral introducing unit 24, respectively.

Hereinafter, the resist mask processing method that can be implemented by using the plasma processing apparatus 10 will be described in detail. Referring back to FIG. 1, as described above, the target object W having thereon the patterned resist mask RM is accommodated in the processing chamber 12 and mounted on the stage 20 in the step S1. The target object W is electrostatically held and attracted on the electrostatic chuck 20b.

Next, in the present embodiment, the plasma of the fluorine-containing gas is excited in the processing chamber of the plasma processing apparatus 10, and the resist mask RM is processed by the plasma thus generated in the step S2.

In the step S2, the fluorine-containing gas is supplied into the processing chamber 12 and the microwave is supplied from the antenna 14 into the processing chamber 12. To that end, in the step S2, the gas is supplied from the gas source G10 into the processing chamber 12 and the microwave is generated by the microwave generator 28 under the control of the control unit Cont. Here, the gas source G10 may be a source of another fluorocarbon-based gas instead of $CH_3F$ gas.

Figure 5:
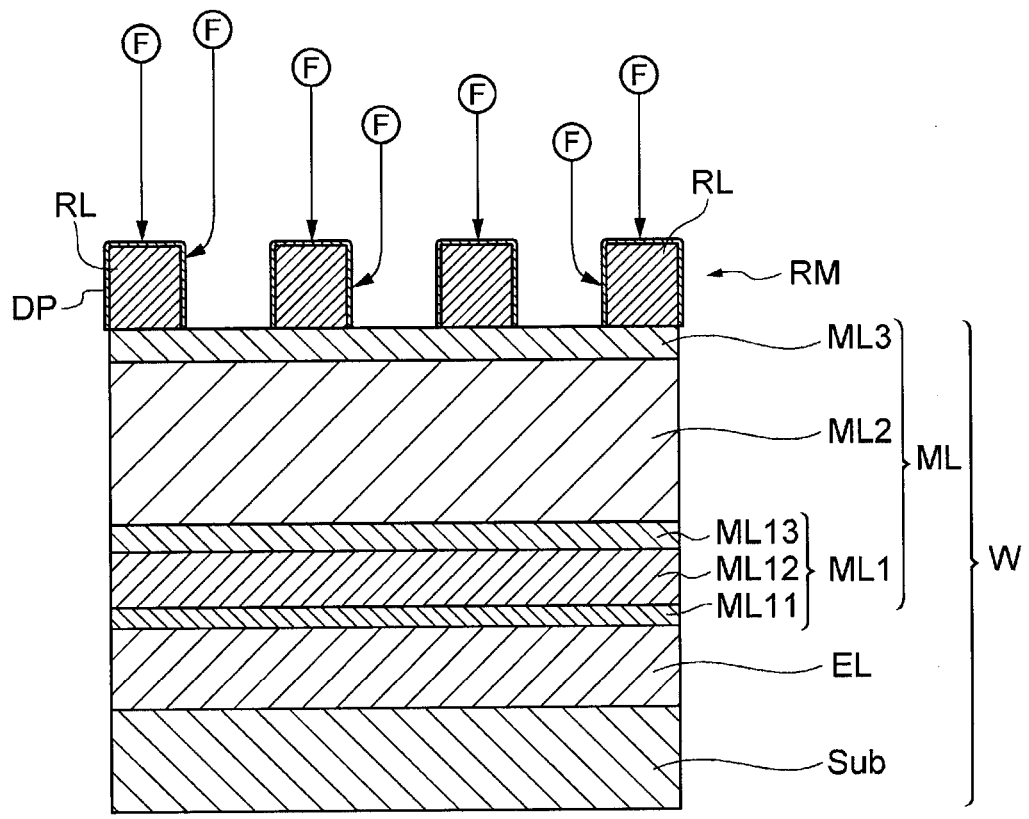
FIG. 5 is a view for explaining the principle of a step S2.

Here, the step S2 will be further described with reference to FIG. 5. FIG. 5 is a view for explaining the principle of the step S2. As shown in FIG. 5, in the step S2, the fluorine-containing gas is excited in the processing chamber 12, so that active species of fluorine such as fluorine radicals, fluorine ions or the like are generated. In FIG. 5, circled "F" indicates the active species of fluorine. In the step S2, a fluorine compound is deposited as a deposit DP on the surface of the resist mask RM or the resist mask RM is modified by the active species of fluorine. By executing the step S2, the shrinkage of the resist mask RM can be prevented until the hard mask M to be described later is formed.

Next, in the present embodiment, as described with reference to FIG. 1, the resist mask RM is processed by the plasma of the hydrogen-containing gas which is excited by the microwave in the step S3.

In the step S3, the hydrogen-containing gas is supplied into the processing chamber 12 and the microwave is supplied from the antenna 14 into the processing chamber 12. In the step S3, an inert gas may be supplied into the processing chamber in addition to the hydrogen-containing gas. To that end, in the step S3, the gases from the gas sources G12 and G14 are supplied into the processing chamber 12 and the microwave is generated by the microwave generator 28 under the control of the control unit Cont. Meanwhile, in the step S3, HBr gas from the gas source G18 may be supplied instead of $H_2$ gas from the gas source G12.

Figure 6:
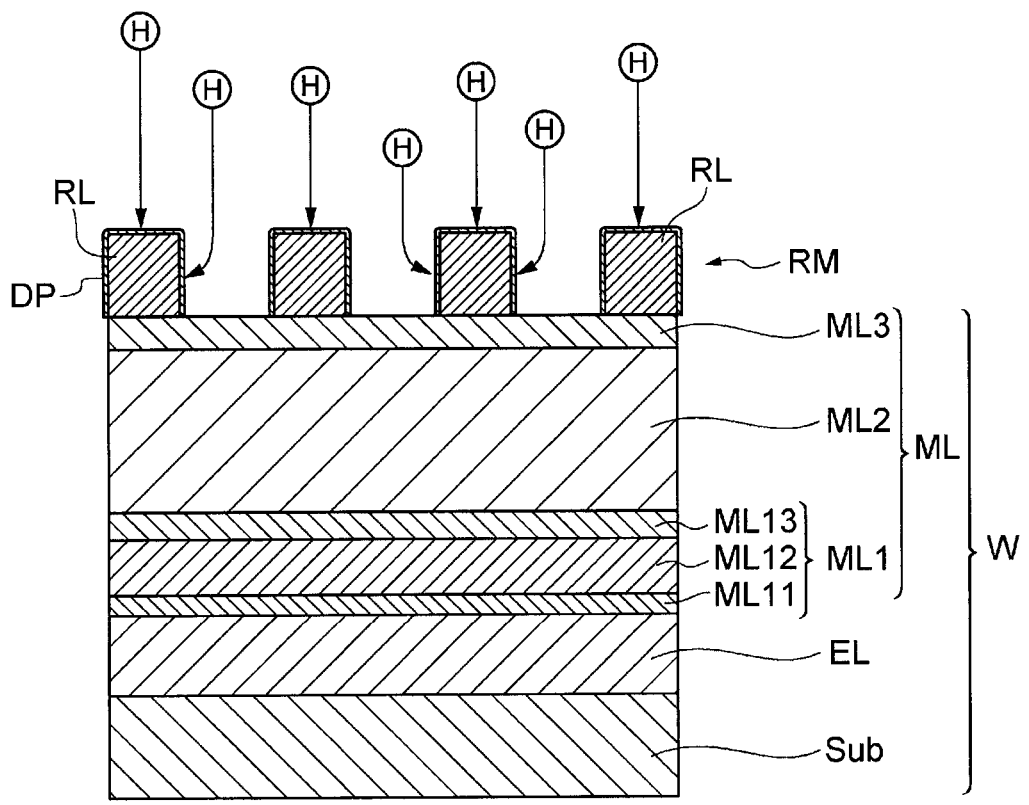
FIG. 6 is a view for explaining the principle of a step S3.

Here, the step S3 will be further described with reference to FIG. 6. FIG. 6 is a view for explaining the principle of the step S3. As shown in FIG. 6, in the step S3, hydrogen radicals are generated by exciting the plasma of the hydrogen-containing gas in the processing chamber 12. In FIG. 6, circled "H" indicates hydrogen radicals. In the step S3, the resist mask RM is modified by the adsorption of the hydrogen radicals onto the resist mask RM and the reaction therebetween. As a result, the resist mask RM is cured. Further, in the step S3, UV rays are generated in the processing chamber 12 by exciting the plasma of the hydrogen-containing gas. UV rays dissociate C—O bond of the side chain of the material forming the resist mask, so that the side chain of the material is disconnected.

Figure 7:
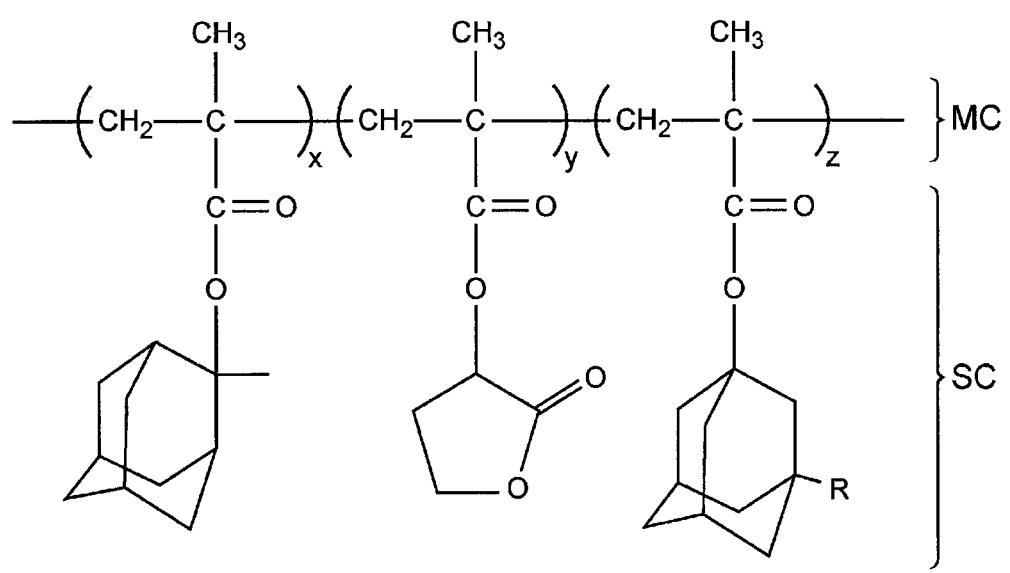
FIG. 7 shows an example of a structure of a material forming a resist mask.

FIG. 7 shows an example of a structure of the material forming the resist mask. In FIG. 7, x, y and z are an integer greater than or equal to 1. In the present embodiment, the resist mask RM can be made of a resist material, which is exposed by an ArF excimer laser. As shown in FIG. 7, the resist mask generally has C—C bond at a main chain (indicated by a notation MC in FIG. 7) and C—O bond at a side chain (indicated by a notation SC in FIG. 7). As described above, UV rays generated in the processing chamber 12 selectively dissociate C—O bond of the side chain, so that the corresponding side chain is disconnected. As a result, the edge of the line RL of the resist mask RM becomes smooth and a more linear shape. Therefore, the variation in the linewidth of the line RL or the linearity of the edge can be improved.

Further, in the step S3, the plasma of the hydrogen gas is excited in the processing chamber 12 by the microwave. The energy of the plasma excited by the microwave is considerably lower than the energy of the plasma excited by an inductively coupled or a parallel plate type plasma processing apparatus. For example, the energy of the plasma excited by the microwave is about ¼ to ⅕ of the energy of the plasma excited by the inductively coupled plasma processing apparatus. Since the low-energy plasma is used, the disconnection of the C—C bond of the main chain of the material forming the resist mask RM is suppressed in the step S3. As a result, the dimensional variation of the resist mask RM is reduced.

Figure 8A:
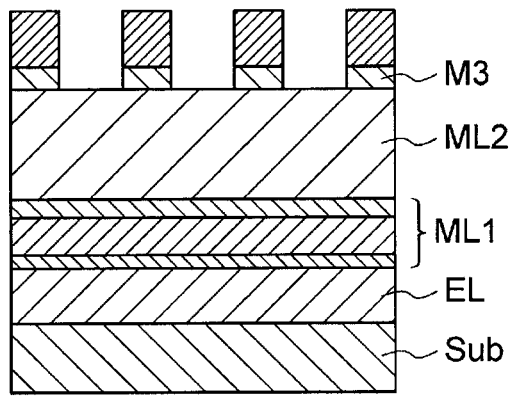
FIGS. 8A to 8C are views for explaining a step S4.
Figure 8B:
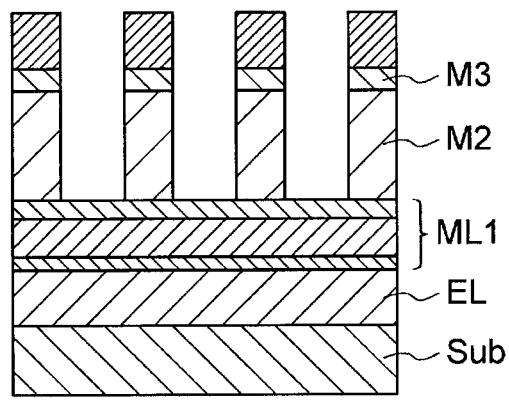
Figure 8C:
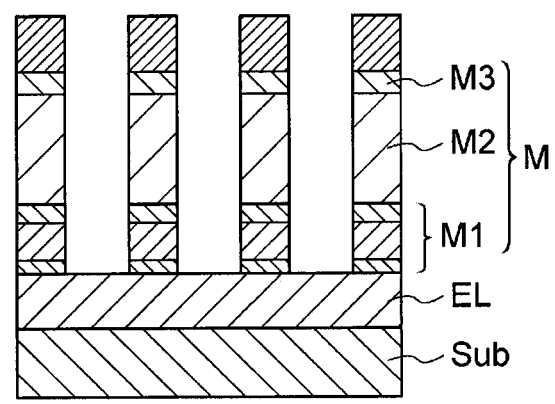

In the present embodiment, as shown in FIG. 1, the laminated body ML is etched in the pattern of the resist mask RM in a step S4 following after the step S3. Hereinafter, the step S4 will be described with reference to FIGS. 8A to 8C. FIGS. 8A to 8C are views for explaining the step S4. As shown in FIG. 8A, the third layer ML3 is first etched. In the case where the third layer ML3 is a SiON layer, in the step S4, gases from the gas sources G10 and G16 are supplied into the processing chamber 12 and the microwave is generated by the microwave generator 28 to be supplied from the antenna 14 into the processing chamber 12 under the control of the control unit Cont. Accordingly, the plasma of $CH_3F$ gas and $CF_4$ gas, i.e., the fluorocarbon-based gas, is generated, and the third layer ML3 is etched in the pattern of the resist mask RM by the active species of fluorine. As a result, the third layer ML3 becomes a mask portion M3 forming a part of the hard mask M.

Next, in the step S4, the second layer ML2 is etched as shown in FIG. 8B. In the case where the second layer ML2 is a SOH layer, gases are supplied from the gas sources G14, G18 and G20 into the processing chamber 12 and the microwave is generated by the microwave generator 28 to be supplied from the antenna 14 into the processing chamber 12 under the control of the control unit Cont. Accordingly, the plasma of HBr gas, $O_2$ gas and Ar gas is generated, and the second layer ML2 is etched in the pattern of the resist mask RM mainly by the active species of Br. As a result, the second layer ML2 becomes a mask portion M2 forming a part of the hard mask M.

Thereafter, in the step S4, the first layer ML1 is etched as shown in FIG. 8C. In the case where the first layer ML1 has a laminated structure of a $SiO_2$ layer, a SiN layer and a $SiO_2$ layer, gases are supplied from the gas sources G10 and G16 into the processing chamber 12 and the microwave is generated by the microwave generator 28 to be supplied from the antenna 14 into the processing chamber 12 under the control of the control unit Cont. Accordingly, the plasma of $CH_3F$ gas and $CF_4$ gas, i.e., the fluorocarbon-based gas, is generated, and the first layer ML1 is etched in the pattern of the resist mask RM by the active species of fluorine. As a result, the first layer ML1 becomes a mask portion M1 forming a part of the hard mask M. As a result of the step S4, the hard mask M is formed as shown in FIG. 8C. In addition, in the present embodiment, the resist mask RM may be removed and the etching target layer EL may be etched in the pattern of the hard mask M after the execution of the step S4. In the case where the etching target layer EL is a polycrystalline silicon layer, the etching target layer EL can be etched by the plasma of HBr gas in the plasma processing apparatus 10.

Hereinafter, test examples 1 and 2 of the resist mask processing method using the plasma processing apparatus 10 in accordance with an embodiment of the present invention will be described. In the test example 1, the steps S1, S3 and S4 were executed. In other words, in the test example 1, after the resist mask RM was modified, the laminated body ML was etched. In the test example 2, the steps S1 to S4 were executed. In other words, the step S2 for processing the resist mask RM by using a plasma of a fluorine-containing gas was executed in addition to the steps executed in the test example 1.

In the test examples 1 and 2, a target object having a following condition was prepared as the target object W.
<Target object W>
Etching target layer EL: polycrystalline silicon layer (60 nm in thickness)
First layer ML1: a three-layer structure of $SiO_2$ layer (8 nm in thickness), SiN layer (40 nm in thickness) and $SiO_2$ layer (21 nm in thickness)
Second layer ML2: SOH layer (120 nm in thickness)
Third layer ML3: SiON layer (23 nm in thickness)

Next, in the test examples 1 and 2, a resist material was coated on the target object W with a thickness of 85 nm by using resist FiARF-E15B manufactured by Fujifilm Electronic Materials Co., Ltd. Then, before the exposure processing, a pre applied bake (PAB) processing was executed at 100° C. for 45 seconds. After the exposure processing, a pose exposure bake (PEB) processing was executed at 95° C. for 45 seconds. Then, the resist was developed. As a consequence, the target object W having thereon the resist mask RM was prepared. The resist mask RM had a line-and-space pattern. Specifically, in the resist mask RM, a plurality of lines RL having a design linewidth DW (see FIG. 2) of 54 nm were arranged in a linewidth direction (X direction in FIG. 2) with spaces RS having a design width DS (see FIG. 2) of 70 nm therebetween. Further, the resist mask RM had a pattern in which two lines RL spaced from each other were positioned on the same straight line (see FIG. 10).

Then, the step S2 was executed only in the test example 2. The processing conditions in the step S2 were as follows.
<Processing Conditions in the Step S2>
Processing gas: $CH_3F$ gas (flow rate of 58 sccm)
Pressure in processing chamber: 50 mT (6.6 Pa)
Microwave power: 2500 W
RF bias power: 300 W
RF bias power frequency: 13.56 MHz
Ratio of flow rate of the central introducing unit to flow rate of the peripheral introducing unit=5:95

Thereafter, the step S3 was executed in both of the test examples 1 and 2. The processing conditions in the step S3 were as follows.
<Processing Conditions in the Step S3>
Processing gas: Ar gas (flow rate of 200 sccm), $H_2$ gas (flow rate of 200 sccm)
Pressure in processing chamber: 100 mT (13.3 Pa)
Microwave power: 3000 W
RF bias power: 0 W
RF bias power frequency: 13.56 MHz
Ratio of flow rate of the central introducing unit to flow rate of the peripheral introducing unit=5:95

Next, the step 4 was executed in both of the test examples 1 and 2. The processing conditions in the step S4 were as follows.

<Processing Conditions in the Step S4>
1) Processing Conditions for the Third Layer ML3
   Processing gas: $CF_4$ gas (flow rate of 150 sccm), $CH_3F$ gas (flow rate of 170 sccm)
   Pressure in the processing chamber: 80 mT (10.6 Pa)
   Microwave power: 2000 W
   RF bias power: 300 W
   RF bias power frequency: 13.56 MHz
   Ratio of flow rate of the central introducing unit to flow rate of the peripheral introducing unit=5:95
2) Processing Conditions for the Second Layer ML2
   Processing gas: Ar gas (flow rate of 1000 sccm), HBr gas (flow rate of 450 sccm), $O_2$ gas (flow rate of 60 sccm)
   Pressure in the processing chamber: 100 mT (13.3 Pa)
   Microwave power: 2500 W
   RF bias power: 150 W
   RF bias power frequency: 13.56 MHz
   Ratio of flow rate of the central introducing unit to flow rate of the peripheral introducing unit=5:95
3) Processing Conditions for the First Layer ML1
   Processing gas: $CF_4$ gas (flow rate of 190 sccm), $CH_3F$ gas (flow rate of 170 sccm)
   Pressure in the processing chamber: 80 mT (10.6 Pa)
   Microwave power: 2500 W
   RF bias power: 300 W
   RF bias power frequency: 13.56 MHz
   Ratio of flow rate of the central introducing unit to flow rate of the peripheral introducing unit=5:95

Figure 9:
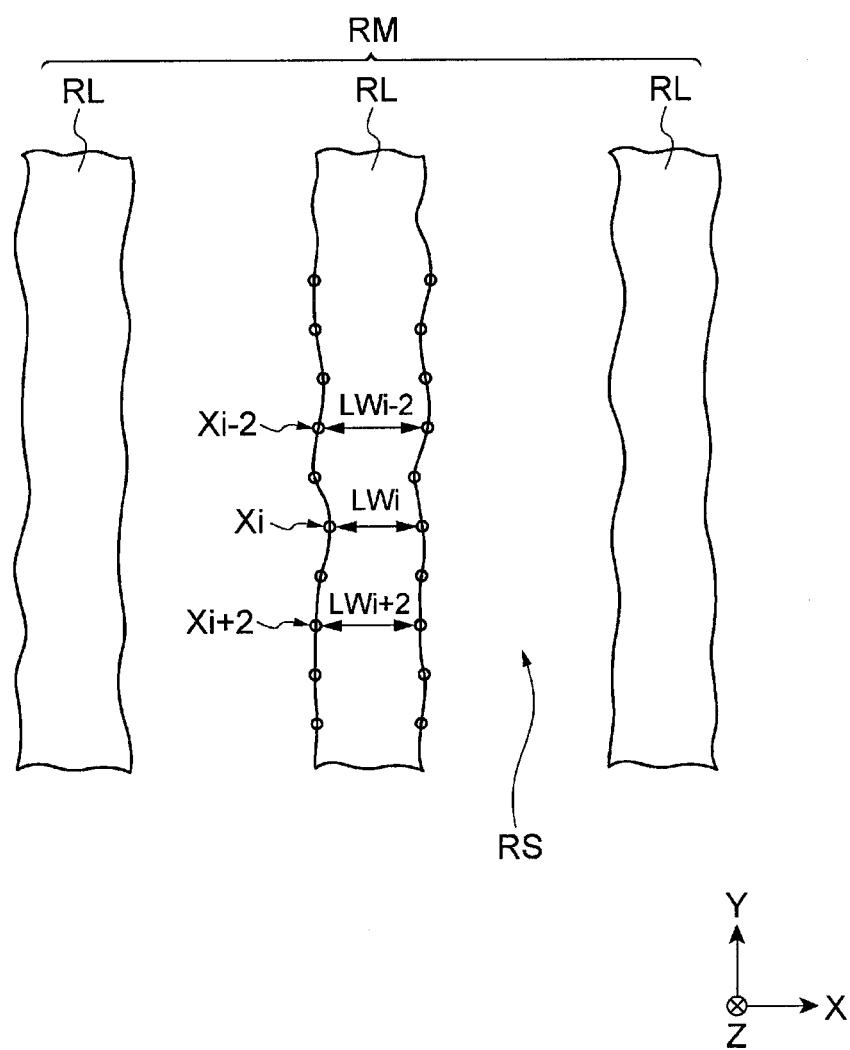
FIG. 9 is a view for explaining a method for calculating LWR and LER.
Figure 10:
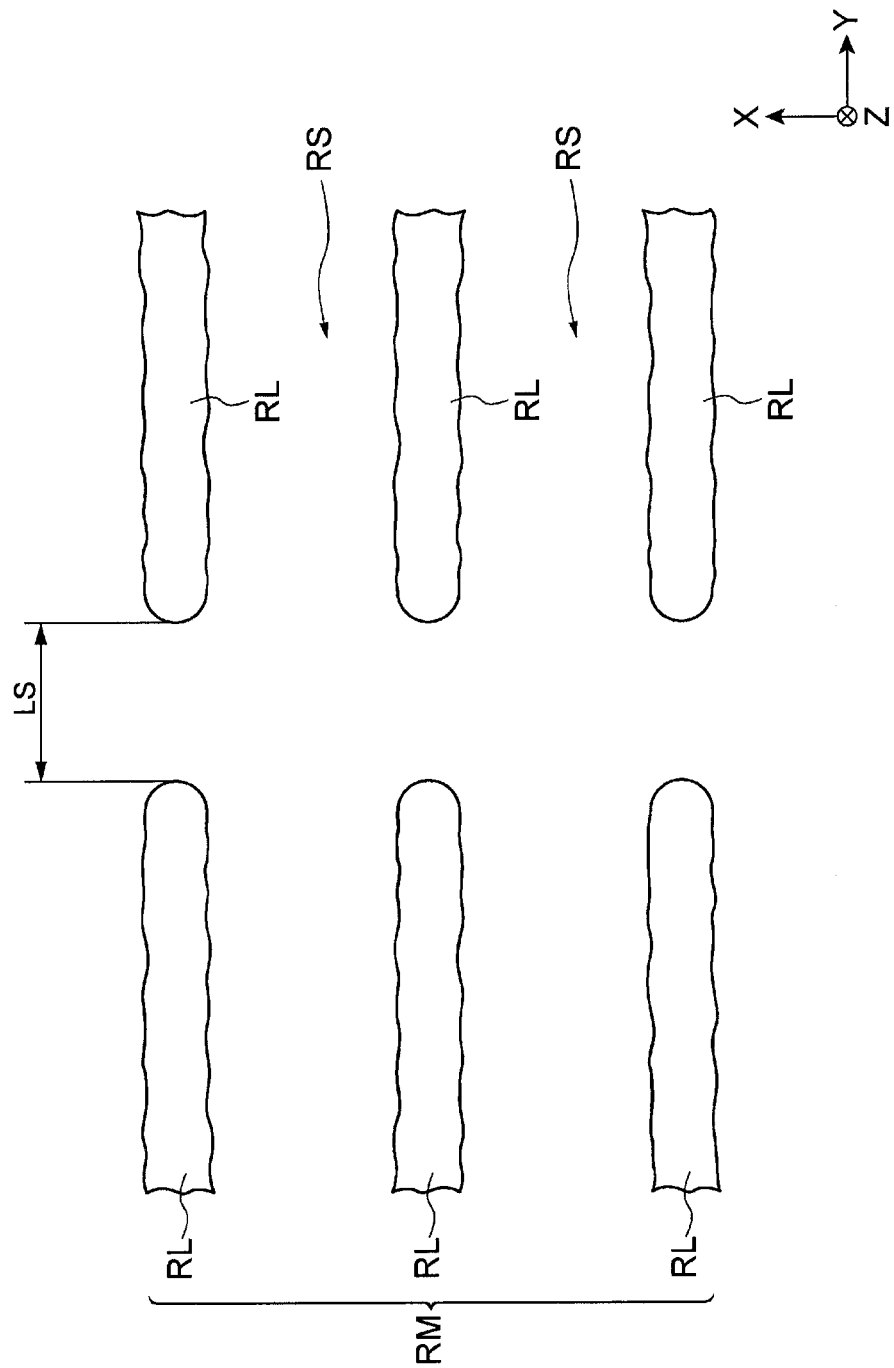
FIG. 10 is a view for explaining a method for calculating a distance between end portions of two lines of the resist mask.

Upon completion of the test examples 1 and 2, the scanning electron microscope (SEM) images of the resist mask RM was captured to obtain a width of the space RS, a linewidth roughness (LWR) and a line edge roughness (LER). Here, the LWR is an index indicating variation in the linewidth of the line RL, and the LER is an index indicating positional variation of the edge of the line RL in the linewidth direction. Specifically, in order to obtain the LWR, as shown in FIG. 9, the SEM images were used to measure three linewidths $LW_i$ at a single line RL at an interval of 11 nm to 12 nm in the lengthwise direction (Y direction) of the corresponding line RL. Further, the LWR was obtained by calculating $3\sigma$ of the acquired linewidth $LW_i$. In order to obtain the LER, the SEM images were used to measure three locations $x_i$ of the edge in the linewidth direction (X direction) at a single line RL at the interval of 11 nm to 12 nm in the lengthwise direction (Y direction) of the corresponding line RL. Further, the LER was obtained by calculating $3\sigma$ of the acquired positions $x_i$. As shown in FIG. 10, a distance LS between end portions of two lines RL positioned on the same straight line was obtained. The SEM images of the resist mask RM after the execution of the step S1 under the conditions same as those of the test examples 1 and 2 were obtained to calculate a width of the space RS, LWR, LER and the distance LS. The result thereof is shown in Table 1. In Table 1, an initial state indicates a state of the resist mask RM before the execution of the steps S2 and S3 under the conditions same as those of the test examples 1 and 2.

TABLE 1

|  | Initial state | test example 1 | test example 2 |
| --- | --- | --- | --- |
| Width of space RS (nm) | 53 | 53 | 53 |
| LWR (nm) | 3.4 | 1.8 | 1.9 |
| LER (nm) | 4.6 | 1.5 | 1.6 |
| LS (nm) | 113 | 144 | 104 |

As can be seen from Table 1, the width of the space RS between the lines of the resist mask in the linewidth direction was the same in the initial state, the test example 1 and the test example 2. In other words, it was found that the width of the space RS in the linewidth direction is not changed by the steps S2 to S4. Further, it was found that in the test example 1, the LWR and the LER were considerably decreased to a level smaller than 2 nm compared to the initial state by the execution of the step S3. In other words, it was verified that the dimensional variation of the resist mask RM was reduced by the step S3. In the test example 2 in which the step S2 was executed in addition to the steps of the test example 1, the distance LS between the end portions of the line became smaller than the distance LS in the test example 1 and was maintained at the substantially same level as the distance LS in the initial state. This indicates that the shrinkage of the line of the resist mask in the lengthwise direction can be suppressed by the step S2. In addition, the LWR and the LER of the test examples 1 and 2 were substantially the same, which indicates that the step S2 did not affect the LWR and the LER.

DESCRIPTION OF REFERENCE NUMERALS

10: plasma processing apparatus
12: processing chamber
14: antenna
16: coaxial waveguide
18: dielectric window
20: stage
22: central introducing unit
24: peripheral introducing unit
28: microwave generator
38: dielectric plate
40: slot plate
58: high frequency power supply
60: matching unit
Cont: control unit
GS: gas supply unit
G10 to G20: gas source
M: hard mask
ML: laminated body
ML11: first layer
ML12: second layer
ML13: third layer
RM: resist mask
EL: etching target layer
W: target object to be processed

What is claimed is:
1. A resist mask processing method comprising:
   preparing, in a processing chamber, a target object on which a patterned resist mask is formed; and
   curing the patterned resist mask by generating a plasma of a hydrogen-containing gas by supplying the hydrogen-containing gas and supplying a microwave into the processing chamber,
   wherein the method further comprises, before said generating the plasma of the hydrogen-containing gas, generating a plasma of a fluorine-containing gas by supplying a fluorine-containing gas and supplying the microwave into the processing chamber where the target object is accommodated.

2. The method of claim 1, wherein the fluorine-containing gas is $CH_3F$ gas.

3. The method of claim 1, wherein said generating the plasma of the fluorine-containing gas suppresses shrinkage of a line of the patterned resist mask in a lengthwise direction of the line of the patterned resist mask.

4. The method of claim 1, wherein the hydrogen-containing gas is $H_2$ gas.

5. The method of claim 1, wherein the plasma of the hydrogen-containing gas which is excited by the microwave disconnects a side chain of a material forming the patterned resist mask while suppressing disconnection of C—C bond of a main chain of the material forming the patterned resist mask.

6. The method of claim 1, wherein the microwave is generated by a microwave generator coupled to the processing chamber.

7. The method of claim 1, further comprising, processing the target object using the fluorine gas excited by the microwave to deposit a fluorine compound on the patterned resist mask.

8. A method for manufacturing a semiconductor device comprising:
preparing, in a processing chamber, a target object on which a laminated body is formed, wherein a patterned resist mask is formed on the laminated body;
generating a plasma of a hydrogen-containing gas by supplying the hydrogen-containing gas and supplying a microwave into the processing chamber to thereby cure the patterned resist mask;
etching the laminated body through the cured resist mask to thereby form a patterned hard mask;
removing the cured resist mask; and
etching the target object through the patterned hard mask,
wherein the method further comprises, before said generating the plasma of the hydrogen-containing gas, generating a plasma of a fluorine-containing gas by supplying a fluorine-containing gas and supplying the microwave into the processing chamber where the target object is accommodated.

9. The method of claim 8, wherein the fluorine-containing gas is $CH_3F$ gas.

10. The method of claim 8, wherein said generating the plasma of the fluorine-containing gas suppresses shrinkage of a line of the patterned resist mask in a lengthwise direction of the line of the patterned resist mask.

11. The method of claim 8, wherein the hydrogen-containing gas is $H_2$ gas.

12. The method of claim 8, wherein the plasma of the hydrogen-containing gas which is excited by the microwave disconnects a side chain of a material forming the patterned resist mask while suppressing disconnection of C—C bond of a main chain of the material forming the patterned resist mask.

13. The method of claim 8, wherein the microwave is generated by a microwave generator coupled to the processing chamber.

14. The method of claim 8, further comprising, processing the target object using the fluorine gas excited by the microwave to deposit a fluorine compound on the patterned resist mask.

15. The method of claim 1, wherein at least a portion of the patterned resist mask remains after the curing is performed.

* * * * *